US011326872B2

(12) United States Patent
Siegler et al.

(10) Patent No.: US 11,326,872 B2
(45) Date of Patent: May 10, 2022

(54) METHOD AND DEVICE FOR CHARACTERIZING THE SURFACE SHAPE OF AN OPTICAL ELEMENT

(71) Applicant: Carl Zeiss SMT GmbH, Oberkochen (DE)

(72) Inventors: Steffen Siegler, Aalen (DE); Thomas Schicketanz, Aalen (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 0 days.

(21) Appl. No.: 17/151,017

(22) Filed: Jan. 15, 2021

(65) Prior Publication Data

US 2021/0140762 A1 May 13, 2021

Related U.S. Application Data

(63) Continuation of application No. PCT/EP2019/066628, filed on Jun. 24, 2019.

(30) Foreign Application Priority Data

Jul. 17, 2018 (DE) ...................... 10 2018 211 853.1

(51) Int. Cl.
*G01B 11/24* (2006.01)
*G01B 9/02001* (2022.01)
(Continued)

(52) U.S. Cl.
CPC ...... *G01B 11/2441* (2013.01); *G01B 9/02011* (2013.01); *G01B 9/02039* (2013.01);
(Continued)

(58) Field of Classification Search
CPC ............ G01B 9/02011; G01B 9/02039; G01B 9/0209; G01B 11/2441; G01B 2290/70; G01M 11/005; G03F 7/70591
See application file for complete search history.

(56) References Cited

U.S. PATENT DOCUMENTS 5,986,760 A 11/1999 Nakayama et al.
7,286,245 B2 10/2007 Wegmann et al.
(Continued)

FOREIGN PATENT DOCUMENTS

DE 19826385 A1 12/1998
DE 10304822 A1 2/2004
(Continued)

OTHER PUBLICATIONS

Wang, Hongjun et al. "Research on encode technology for aspherical surface measurement based on real-time hologram". Proc. SPIE 6279, 27th International Congress on High-Speed Photography and Photonics; 62797J, Jan. 29, 2007. (Year: 2007).*

(Continued)

*Primary Examiner* — Michael A Lyons
(74) *Attorney, Agent, or Firm* — Edell, Shapiro & Finnan, LLC (57) ABSTRACT

A method and a device for characterizing the surface shape of an optical element. In the method, in at least one interferogram measurement carried out by an interferometric test arrangement, a test wave reflected at the optical element is caused to be superimposed with a reference wave not reflected at the optical element. In this case, the figure of the optical element is determined on the basis of at least two interferogram measurements using electromagnetic radiation having in each case linear input polarization or in each case circular input polarization, wherein the input polarizations for the two interferogram measurements differ from one another.

19 Claims, 5 Drawing Sheets

(51) Int. Cl.
  *G01M 11/00* (2006.01)
  *G03F 7/20* (2006.01)
  *G01B 9/02* (2022.01)

(52) U.S. Cl.
  CPC ....... *G01M 11/005* (2013.01); *G03F 7/70591* (2013.01); *G01B 2290/70* (2013.01)

(56) References Cited

U.S. PATENT DOCUMENTS

| | | | |
|---|---|---|---|
| 8,542,356 | B2 | 9/2013 | Fiolka et al. |
| 10,042,264 | B2 | 8/2018 | Wirsing |
| 2006/0158657 | A1 | 7/2006 | De Lega et al. |
| 2007/0171427 | A1* | 7/2007 | Shiode ................ G03F 7/70566 356/495 |
| 2015/0192769 | A1 | 7/2015 | Dresel et al. |
| 2016/0085061 | A1 | 3/2016 | Schwab |
| 2016/0106319 | A1* | 4/2016 | Yasuno .............. G01B 9/02091 600/425 |
| 2017/0343449 | A1 | 11/2017 | Stiepan et al. |
| 2018/0106591 | A1 | 4/2018 | Hetzler et al. |
| 2018/0263709 | A1* | 9/2018 | 'T Hooft ................ G01L 1/246 |

FOREIGN PATENT DOCUMENTS

| | | |
|---|---|---|
| DE | 102007056200 A1 | 5/2009 |
| DE | 102009015393 B3 | 9/2010 |
| DE | 102014205406 A1 | 9/2015 |
| DE | 102015209490 A1 | 11/2016 |
| JP | 2007198896 A | 8/2007 |
| JP | 2010101898 A | 5/2010 |
| JP | 2018511783 A | 4/2018 |
| WO | 2016110467 A1 | 7/2016 |

OTHER PUBLICATIONS

Liu, Feng-wei et al. "Simultaneous phase-shifting interferometry study based on the common-path Fizeau interferometer", Proc. SPIE 9282, 7th International Symposium on Advanced Optical Manufacturing and Testing Technologies: Optical Test and Measurement Technology and Equipment, 92821Z, Sep. 18, 2014. (Year: 2014).*
German Office Action with English translation, Application No. 10 2018 211 853.1, dated Mar. 22, 2019, 10 pages.
Clark Jones, "A New Calculus for the Treatment of Optical Systems", J.O.S.A, vol. 31, Jul. 1941, pp. 500-503.
International Preliminary Report and Written Opinion, PCT/EP2019/066628, dated Jan. 19, 2021, 17 pages.
International Search Report, PCT/EP2019/066628, dated Sep. 20, 2019, 5 pages.
Geh et al., "The impact of projection lens polarization properties on lithographic process at hyper-NA", Proceedings of the SPIE—International Society for Optical Engineering SPIE—Vertical-Cavity Surface-Emitting Lasers XIII, SPIE OPTO, vol. 6520, Mar. 9, 2007, 19 pages.
JP-Office Action with English translation, for JP 2021-502619 dated Feb. 24, 2022, 5 pages.

* cited by examiner

METHOD AND DEVICE FOR CHARACTERIZING THE SURFACE SHAPE OF AN OPTICAL ELEMENT

CROSS REFERENCE TO RELATED APPLICATIONS

This is a Continuation of International Application PCT/EP2019/066628, which has an international filing date of Jun. 24, 2019, and the disclosure of which is incorporated in its entirety into the present Continuation by reference. This Continuation also claims foreign priority under 35 U.S.C. § 119(a)-(d) to and also incorporates by reference, in its entirety, German Patent Application DE 10 2018 211 853.1 filed on Jul. 17, 2018.

FIELD OF THE INVENTION

The invention relates to a method and a device for characterizing the surface shape of an optical element.

BACKGROUND

Microlithography is used for production of microstructured components, such as integrated circuits or liquid crystal displays (LCDs), for example. The microlithography process is conducted in a so-called projection exposure apparatus, which comprises an illumination device and a projection lens. The image of a mask (=reticle) illuminated with the illumination device is in this case projected by the projection lens onto a substrate (e.g. a silicon wafer) that is coated with a light-sensitive layer (photoresist) and arranged in the image plane of the projection lens in order to transfer the mask structure to the light-sensitive coating of the substrate.

In projection lenses designed for the extreme ultraviolet (EUV) range, i.e., at wavelengths of, e.g., approximately 13 nm or approximately 7 nm, mirrors are used as optical components for the imaging process, owing to the lack of availability of suitable light-transmissive refractive materials. Typical projection lenses designed for the EUV, as known e.g. from US 2016/0085061 A1, may have for example an image-side numerical aperture (NA) in the region of NA=0.55 and image an (e.g., ring-segment-shaped) object field into the image plane or wafer plane.

The increase of the image-side numerical aperture (NA) is typically accompanied by an enlargement of the required mirror areas of the mirrors used in the projection exposure apparatus. This in turn has the consequence that, in addition to manufacturing, testing the surface shape of the mirrors also presents a demanding challenge. Interferometric measurement methods, in particular, are used here for highly accurate testing of the mirrors.

In this case, the use of computer-generated holograms (CGHs) is also known, inter alia, wherein in particular at least one further "calibration functionality" for providing a reference wavefront that serves for calibration or error correction can be encoded in one and the same CGH in addition to the functionality that is required for the actual test (i.e. the CGH structure that is designed in accordance with the mirror shape for shaping the wavefront that mathematically corresponds to the test specimen shape).

Furthermore, it is also known, for example, in a Fizeau arrangement, to generate an interferogram between a reference wave reflected at a reference surface ("Fizeau plate") and a test wave reflected at the mirror.

One problem that occurs in practice is that the interferogram phase which is ascertained during the respective interferogram measurement and is used for the respective figure determination has further phase components besides the phase component that is actually to be determined (in accordance with the surface shape or figure of the test specimen). Said further phase components comprise, inter alia, polarization-induced phase components e.g. on account of diverse influences of the polarization state (such as, for example, as a result of birefringent layers present at optical elements, stress birefringents, etc.) which occur in the respective optical system and which corrupt the results obtained during the figure determination.

Compensation or targeted computational extraction of said polarization-induced phase components requires as accurate knowledge thereof as possible. Polarization measurements that can be carried out for this purpose prove to be complex, however, and may again for their part exhibit errors.

With regard to the prior art, reference is made merely by way of example to US 2016/0085061 A1, DE 198 26 385 A1, DE 10 304 822 A1, US 2015/0192769 A1, DE 10 2014 205 406 A1 and DE 10 2009 015 393 B3 and the publications B. Geh et al.:. "The impact of projection lens polarization properties on lithographic process at hyper-NA", Proc. of SPIE Vol. 6520, 65200F, 2007 Article number: 65200F: —ISSN 1996-756X (E); 0277-786X (P), DOI: 10.1117/12.722317 and R. Clark Jones: "A New Calculus for the Treatment of Optical Systems: I "Description and Discussion of the Calculus", II "Proof of 3 general equivalence theorems", III "The Sohncke theory of optical activity"", in: Journal of the Optical Society of America (JOSA), vol. 31 (1941), vol. 7 pages 500-503, ISSN 0030-3941 (P), DOI: 10.1364/JOSA.31.000500.

SUMMARY

Against the above background, it is an object of the present invention to provide a method and a device for characterizing the surface shape of an optical element, which make possible an increased accuracy while at least partly avoiding the problems described above.

This object is achieved in accordance with the features of the independent claims.

In a method for characterizing the surface shape of an optical element, in at least one interferogram measurement carried out by an interferometric test arrangement, a test wave reflected at the optical element is caused to be superimposed with a reference wave not reflected at the optical element.

The method is characterized in that the figure of the optical element is determined on the basis of at least two interferogram measurements using electromagnetic radiation having in each case linear input polarization or in each case circular input polarization, wherein the input polarizations for said two interferogram measurements differ from one another.

In accordance with one embodiment, the figure of the optical element is determined on the basis of at least two interferogram measurements using electromagnetic radiation having linear input polarization, wherein the input polarizations for said two interferogram measurements differ from one another with regard to the polarization direction of the electromagnetic radiation.

In accordance with one embodiment, the input polarizations for said two interferogram measurements are orthogonal to one another.

In accordance with one embodiment, the figure of the optical element is determined on the basis of an averaging of interferogram phases respectively obtained during said two interferogram measurements.

The invention firstly proceeds from the consideration that with regard to the further phase components present besides the phase component that is actually to be determined (in accordance with the figure of the test specimen) in the interferogram phase ascertained by the interferometric test arrangement, in particular two polarization-induced components can be differentiated:

A first polarization-induced phase component is caused by the polarization effect in those regions of the optical system or of the interferometric test arrangement which are not jointly traversed by the light waves attaining interference (i.e. reference wave and test wave).

In addition to this first component, a second polarization-induced phase component is caused by the polarization effect in those regions of the optical system which are traversed jointly by the light waves attaining interference (i.e. reference wave and test wave), to put it more precisely by the coupling between this polarization effect and the abovementioned polarization effect of the first component.

Against the background that a contribution of regions in the optical system which are traversed equally by the light waves attaining interference is actually involved, the existence of said second polarization-induced phase component, in contrast to the first polarization-induced phase component, is not immediately trivial, but rather follows from the coupling mentioned above and a mathematical examination employing the Jones formalism known per se.

In this context, reference is made to the publication B. Geh et al.: "The impact of projection lens polarization properties on lithographic process at hyper-NA", Proc. of SPIE Vol. 6520, 65200F, 2007.

In this case, the Jones matrices for the polarization effects of the individual portions present in the interferometric test arrangement can be represented by way of a decomposition into elementary polarization elements, i.e. as a product of a scalar transmission, a factor having a scalar phase and three Jones matrices for a rotator, a rotated dichroic polarizer and a rotated, phase-retarding polarization-influencing element (called "retarder" hereinafter).

In order to estimate the effects, in a simplified way, consideration is given only to a linear, but not to a circular or chiral polarization effect (generally negligible in interferometer optics) as a result of dichroism and retardation and it is furthermore assumed that dichroism and retardation are manifested in each case to a comparatively small extent in the respective portions of the interferometer, such that some of the resulting equations can be developed up to a specific order in these magnitudes. In this case, the development in the strengths of dichroism and retardation in the jointly traversed portions is carried out only up to linear terms in these magnitudes, that is to say up to the 1st order.

In the respective interferometer portions that are traversed separately by the light waves attaining interference in the test arrangement, developments are carried out up to orders higher than the 1st order, and the polarization effect is described for each split wave by Jones matrices with usually respectively different strengths for dichroism and retardation and in the normal case respectively different axial directions of dichroism and retardation.

Since the polarization effect is large primarily in the case of polarization elements with large beam deflections, the polarization effect expected of a diffractive structure present in the test arrangement is usually greater than that expected of the other polarization elements present in the test arrangement. Therefore, for the estimation, developments in the magnitudes for dichroism and retardation are carried out approximately only up to the 1st order for the jointly traversed part and up to higher orders for the portions traversed separately following the diffractive structure. A development in the strengths of dichroism and retardation for the diffractive structure only up to a certain order may be motivated by the fact that the phase effect thereof is generally significantly smaller in comparison with the scalar phase caused by the diffractive structure.

Furthermore, the simplification is made that the axial directions of the linear dichroic polarizer and of the linear retarder in the Jones matrices with respect to the waves split by the diffractive structure coincide in each case for the individual waves. This collinearity in the axial directions for each wave that arises is approximately afforded in the case of a diffractive structure.

If portions in the interferometer are traversed twice, then the Jones matrix on the return path of the propagation of light follows from the Jones matrix for the outgoing path in accordance with the publication R. Clark Jones: "A New Calculus for the Treatment of Optical Systems: I Description and Discussion of the Calculus", JOSA, Vol. 31 (1941).

In order that the interferogram phases can be calculated analytically more simply from modulating intensities for the orthogonal linear or circular input polarizations, all the Jones matrices are represented in the basis of the Pauli matrices known per se, and use is made of the Stokes formalism known per se, which is equivalent to the Jones formalism, with complex-valued Müller matrices describing the interference.

In further applications of the invention, a reference wave can also be generated by reflection at a Fizeau surface, the described formalism still remaining valid. For the reference wave generated at a Fizeau surface, the magnitudes of dichroism and retardation can then be set approximately to zero since at the Fizeau surface, in the normal case, light incidence that is as perpendicular as possible is desired, as a result of which the polarization effect is vanishingly small.

Further phase components occurring in addition to the polarization-induced phase components described above (besides the phase component that is actually to be determined in accordance with the figure of the test specimen) in the interferogram phase ascertained by the interferometric test arrangement comprise, inter alia, a modulating phase component (e.g. on account of displacements of the respective reference mirror or of the reference surface) and, with the use of a diffractive (e.g. CGH) structure, a phase component resulting from the scalar phases from the Jones matrices of said diffractive structure.

Proceeding from the considerations mentioned above, the invention is then based on the concept, in particular, of significantly reducing the second polarization-induced phase component by virtue of the fact that the figure determination is effected on the basis of two determinations of the interferogram phase, which differ from one another in the input polarization respectively chosen.

In particular, the mutually different input polarizations can be mutually orthogonal linear polarization states, which are in turn chosen such that these linear polarization states correspond in the polarization direction to the direction of the eigenvectors of the Jones matrix describing the polarization effect of the optical system in the region thereof traversed jointly by reference wave and test wave.

As a result of this choice of input polarizations, firstly, a reduction of the polarization effect in said region traversed jointly by reference wave and test wave and thus also a reduction of the coupling described above are achieved. Secondly, as is evident from a mathematical consideration that will also be explained below, a further reduction of the polarization effect is achieved by averaging the respectively calculated interferogram phases on the basis of said input polarizations.

The disclosure is not restricted to carrying out two interferogram measurements of linear input polarization. Rather, the intention is for the present disclosure to be deemed also to encompass embodiments in which the figure of the optical element is determined on the basis of one interferogram measurement using electromagnetic radiation having linear input polarization, since this already achieves a reduction of the polarization effect in the region traversed jointly by reference wave and test wave and thus also a reduction of the coupling described above.

The abovementioned determination of the figure of the optical element on the basis of an averaging of interferogram phases respectively obtained during two interferogram measurements with mutually orthogonal input polarizations is also advantageous for any other (not necessarily linear) input polarizations.

Therefore, in accordance with a further aspect, the invention also relates to a method for characterizing the surface shape of an optical element, wherein in at least one interferogram measurement carried out by an interferometric test arrangement, a test wave reflected at the optical element is caused to be superimposed with a reference wave not reflected at the optical element, wherein the figure of the optical element is determined on the basis of an averaging of interferogram phases respectively obtained during two interferogram measurements, wherein the input polarizations for said two interferogram measurements are orthogonal to one another.

In embodiments of the invention, the two interferogram measurements mentioned above are carried out on the optical element to be characterized with regard to the surface shape.

In further embodiments of the invention, the two interferogram measurements mentioned above can also be carried out in the context of a prior calibration on an arbitrary calibration test specimen in order in this way, for example, firstly to ascertain the difference between the polarization-induced interferogram phases on the basis of said interferogram measurements. Afterward, the interferogram measurement can then be carried out on the optical element that is actually to be characterized with regard to its surface shape using only a single one of the two input polarizations used in the prior calibration, whereupon the figure of the test specimen is determined both on the basis of the interferogram phase obtained in this case and on the basis of the difference between the polarization-induced interferogram phases for the two mutually orthogonal input polarizations, said difference being ascertained on the basis of the prior calibration. Said mutually orthogonal input polarizations can be in each case linear input polarizations or else circular input polarizations.

The interferogram measurements carried out in the prior calibration can then be utilized during the interferogram measurement carried out on the optical element that is actually to be characterized with regard to its surface shape for conversion to the corresponding average value for the two input polarizations used, in accordance with the formula $\varphi_1 = 0.5 \cdot (\varphi_1 + \varphi_2) - 0.5 \cdot (\varphi_{1,k} + \varphi_{2,k}) + \varphi_{1,k}$. In this case, $\varphi_1$ and $\varphi_2$ denote the two mutually orthogonal input polarizations, where the index k stands for the prior calibration.

As a result, the prior calibration described above makes it possible to avoid an increase in the measurement time that concomitantly arises when carrying out two interferogram measurements for the actual test specimen.

In further embodiments, the prior calibration mentioned above can also be carried out—in addition to two mutually perpendicular linear input polarizations—for a circular input polarization. In conjunction with such a prior calibration, it is possible to carry out the later interferogram measurement on the optical element that is actually to be characterized with regard to its surface shape for a circular input polarization (possibly desired for the purpose of contrast enhancement) as well, since the prior calibration can then be utilized for conversion into corresponding interferogram phases for the two mutually perpendicular linear input polarizations (or one averaged interferogram phase analogously to the embodiments above).

The optical element to be characterized with regard to its surface shape can be a mirror, in particular. Furthermore, the optical element can be designed for an operating wavelength of less than 30 nm, in particular less than 15 nm. In particular, the optical element can be an optical element of a microlithographic projection exposure apparatus.

The invention furthermore relates to a device for characterizing the surface shape of an optical element, in particular of an optical element of a microlithographic projection exposure apparatus, wherein the device is configured to carry out a method having the features described above.

With regard to advantages and advantageous configurations of the device, reference is made to the above explanations in association with the method according to the invention.

Further configurations of the invention can be gathered from the description and the dependent claims. The invention is explained in greater detail below on the basis of exemplary embodiments illustrated in the accompanying figures.

DETAILED DESCRIPTION

Figure 5:
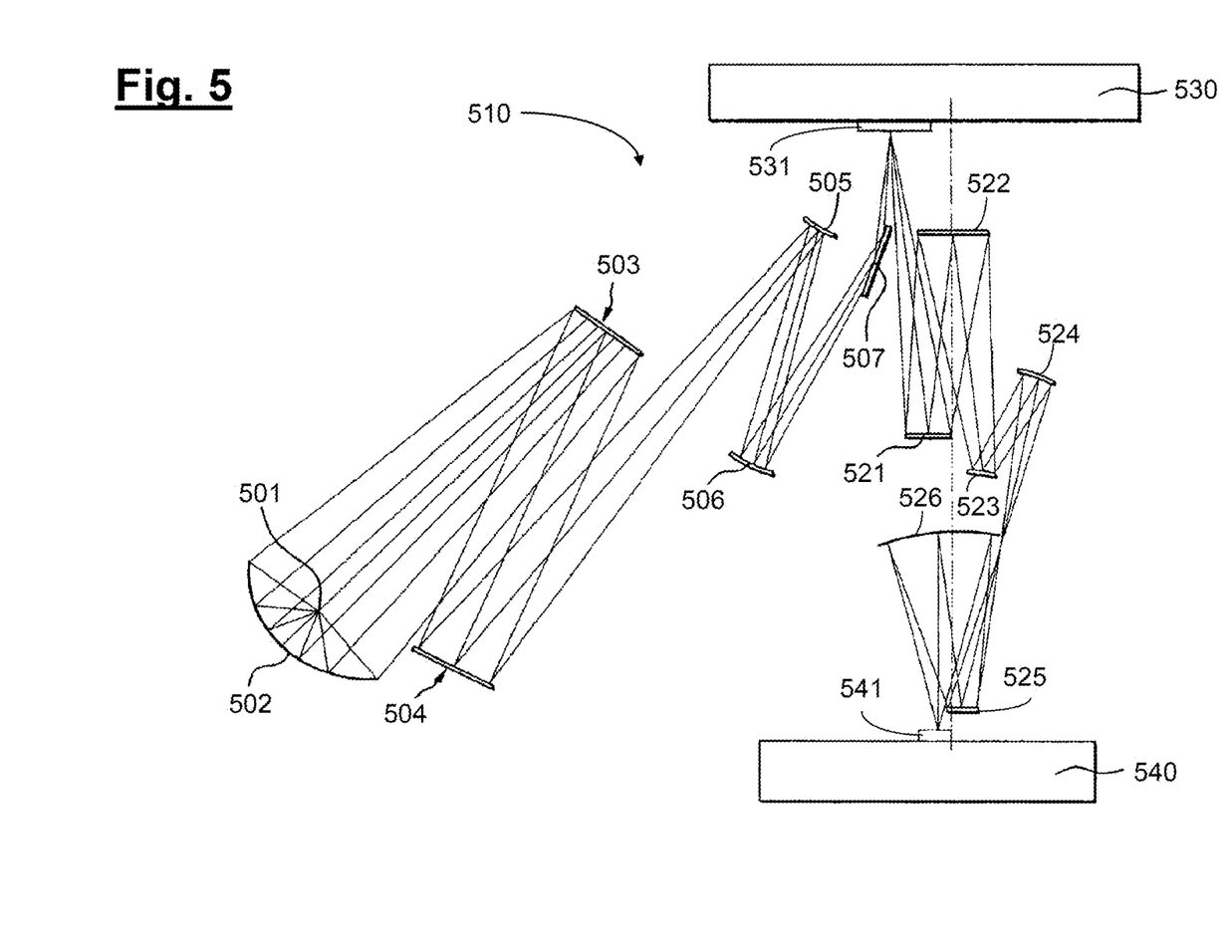
FIG. 5 shows a schematic illustration of a projection exposure apparatus designed for operation in the EUV.

FIG. 5 firstly shows a schematic illustration of an exemplary projection exposure apparatus which is designed for operation in the EUV and which comprises mirrors which are testable with a method according to the invention.

In accordance with FIG. 5, an illumination device in a projection exposure apparatus 510 designed for the EUV comprises a field facet mirror 503 and a pupil facet mirror 504. The light from a light source unit comprising a plasma light source 501 and a collector mirror 502 is directed at the field facet mirror 503. A first telescope mirror 505 and a second telescope mirror 506 are arranged in the light path downstream of the pupil facet mirror 504. A deflection mirror 507 is arranged downstream in the light path, said deflection mirror directing the radiation that is incident thereon at an object field in the object plane of a projection lens comprising six mirrors 521-526. At the location of the object field, a reflective structure-bearing mask 531 is arranged on a mask stage 530, said mask being imaged with the aid of the projection lens into an image plane in which a substrate 541 coated with a light-sensitive layer (photoresist) is situated on a wafer stage 540.

The optical element which is tested by the method according to the invention in an interferometric test arrangement described below can be e.g. an arbitrary mirror of the projection exposure apparatus 510.

Figure 1:
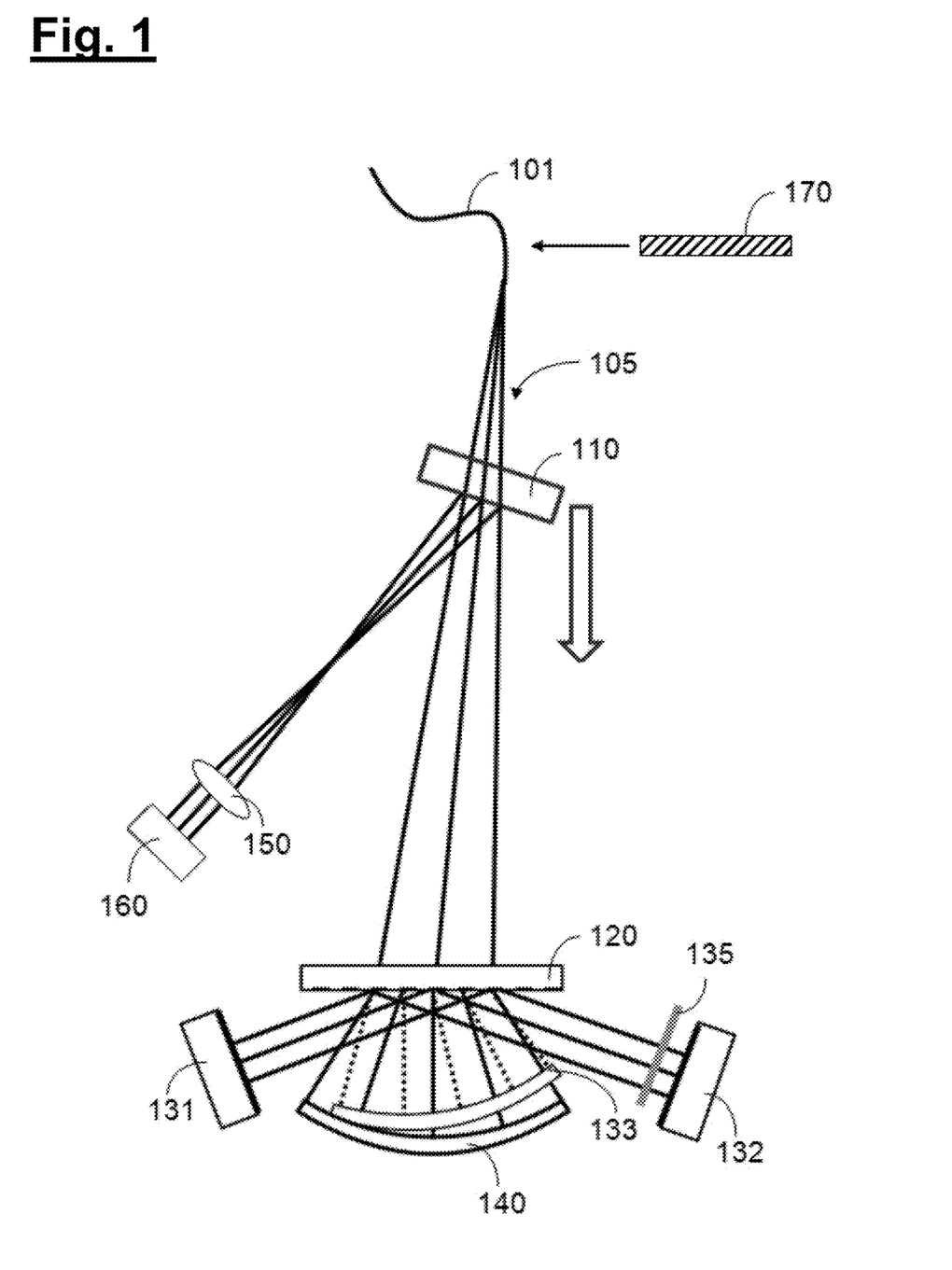
FIG. 1 shows a schematic illustration for elucidating the possible set-up of an interferometric test arrangement that can be used in the method according to the invention.

FIG. 1 shows a schematic illustration for elucidating a possible set-up of an interferometric test arrangement for testing a mirror using a CGH.

In accordance with FIG. 1, the illumination radiation generated by a light source (not illustrated) and emerging from the exit surface of an optical waveguide 101 emerges as an input wave 105 having a spherical wavefront, passes through a beam splitter 110 and is then incident on a complexly coded CGH 120. The CGH 120 generates a total of four output waves from the input wave 105 in transmission in the example in accordance with its complex coding, one output wave of which impinges as a test wave on the surface of the optical element to be characterized with regard to its surface shape in the form of a mirror 140 with a wavefront adapted to the target shape of the surface of said mirror 140. Furthermore, the CGH 120 generates three further output waves from the input wave 105 in transmission, each of which further output waves is incident on a respective further reflective optical element 131, 132 and 133. "135" denotes a shutter. The CGH 120 also serves for superimposing the test wave reflected from the mirror 140 and the reference waves reflected from the elements 131-133, which are incident as convergent beams again on the beam splitter 110 and are reflected from the latter in the direction of an interferometer camera 160 designed as a CCD camera, in the course of which they pass through an eyepiece 150. The interferometer camera 160 captures an interferogram generated by the interfering waves, the actual shape of the optical surface of the mirror 140 being determined from said interferogram by way of an evaluation device (not illustrated).

In the concept underlying the present invention, the optical system or the interferometric test arrangement is subdivided into portions traversed jointly by the light waves attaining interference and into portions traversed separately or not jointly by the light waves attaining interference. The separating point between the jointly traversed portions and the separately traversed portions is formed here by a diffractive structure (the CGH 120 in FIG. 1). In this case, the part of the system from the illumination source to the diffractive structure (including illumination optical unit) should likewise be regarded as a jointly traversed portion since separation of the waves arises only at the diffractive structure. The portion of the interferometer from the diffractive structure to the interferometer camera is likewise a jointly traversed part of the system. These two jointly traversed parts of the system can have different strengths for dichroism and retardation and respectively different axial directions for the dichroic polarizer and retarder. In the portions traversed separately or not jointly, on account of splitting at the diffractive structure, the polarization effect in the normal case is predominantly given by the polarization effect of the diffractive structure; all other polarization effects in these portions can usually be disregarded since the incidence of light on the test, reference and calibration surfaces is preferably perpendicular and thus has virtually no polarization effect.

According to the invention, then, the figure of the optical element or mirror 140 is determined on the basis of at least one interferogram measurement using electromagnetic radiation having linear input polarization. In particular, the method according to the invention can comprise at least two interferogram measurements using electromagnetic radiation having linear input polarization, wherein the input polarizations for said two interferogram measurements are orthogonal to one another. In this case, preferably, the input polarizations used for said two interferogram measurements correspond in terms of their polarization direction to the directions of the eigenvectors of a Jones matrix that describes the polarization effect of the interferometric test arrangement in the region thereof traversed jointly by reference wave and test wave.

The corresponding input polarization is set using a polarization-influencing element 170, which is indicated schematically in FIG. 1 and which can be configured and arranged variably in the optical beam path in any suitable way. In embodiments, it is possible to use a suitable polarizer for setting linear polarization in combination with a lambda/2 plate for switching between the respective polarization directions. In further embodiments, it is possible to use a suitable polarizer in combination with a rotatable lambda/2 plate and a rotatable lambda/4 plate for setting orthogonal linear and circular input polarizations.

Figure 2:
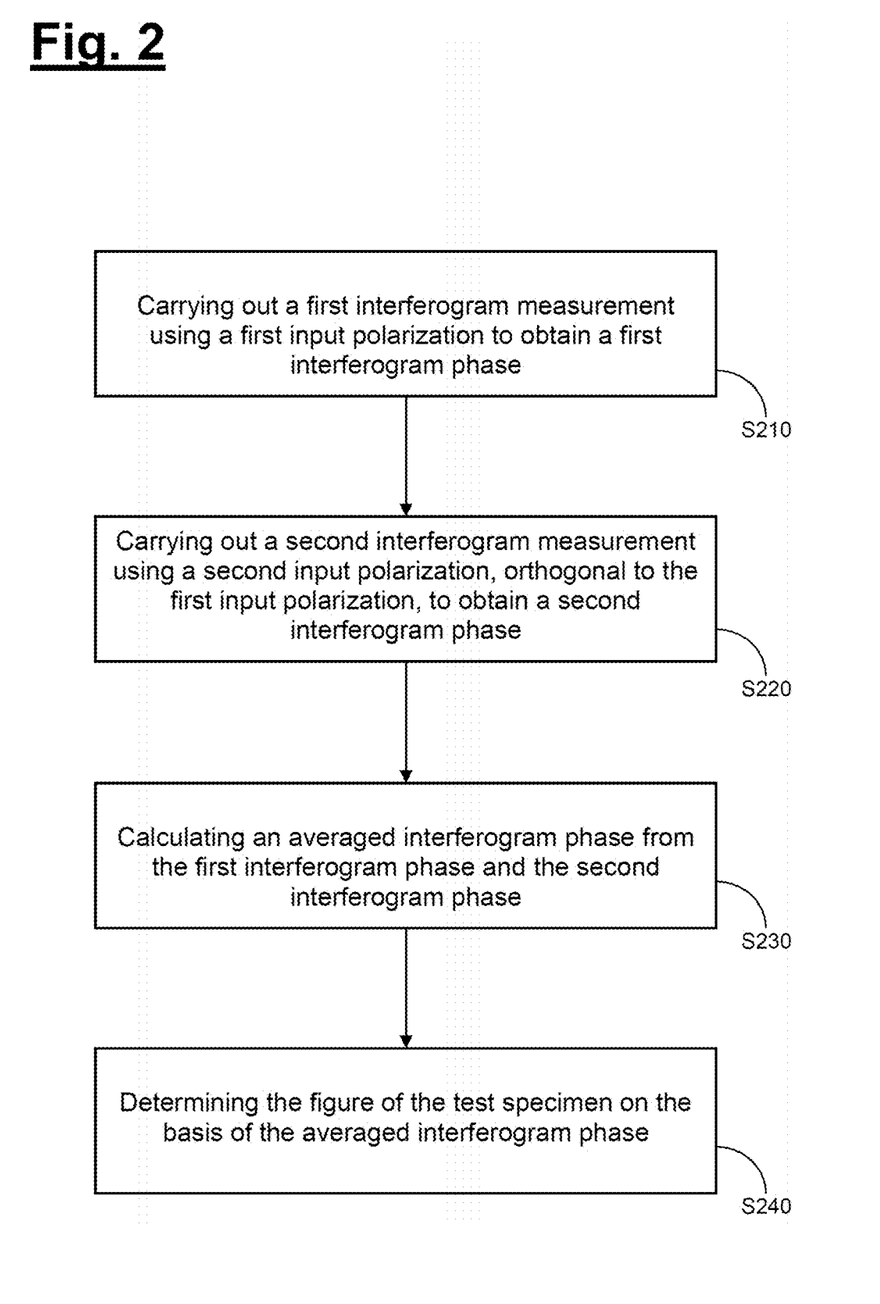
FIGS. 2-3 show flow diagrams for elucidating exemplary embodiments of a method according to the invention.

In a first embodiment of the method according to the invention, the two interferogram measurements mentioned above can be performed directly on the optical element to be characterized with regard to its surface shape, which is implemented in steps S210 and S220 with reference to the flow diagram shown in FIG. 2. Afterward, in accordance with FIG. 2, in step S230 an averaged interferogram phase is calculated from the two interferogram phases obtained in steps S210 and S220, and in step S240 the figure of the test specimen is determined on the basis of said averaged interferogram phase.

In this case, the input polarizations used in the two interferogram measurements mentioned can be linear input polarizations or else circular input polarizations.

With the aid of an analytical estimation, it is then possible to show that the polarization-induced phase portion in the interferogram phase up to a specific order both comprises identical terms (i.e. terms independent of the input polarization) for the mutually orthogonal input polarizations and comprises a term which has the same absolute value but an opposite sign for the mutually orthogonal input polarizations. This has the consequence that only the terms which are identical for the mutually orthogonal input polarizations or are independent thereof remain during the abovementioned averaging according to the invention.

With the aid of the analytical estimation described in the introduction, the following formal expressions arise for the second polarization-induced phase portion in the interferogram phase with the use of two linear and orthogonal input polarizations.

$$\varphi_{2,linear} = \varphi_{2,unpol,linear}^{(3)} \pm \varphi_{2,pol,linear}^{(2)} \quad (1)$$

With the use of two circular and orthogonal input polarizations it holds true that:

$$\varphi_{2,circular} = \varphi_{2,unpol,circular}^{(1)} \pm \varphi_{2,pol,circular}^{(1)} \quad (2)$$

For the respective two different and mutually orthogonal input polarizations, the polarization-dependent component, designated by the subscripted index "pol", differ in the two preceding different signs. The expressions indicated are regarded as development only to an approximation and only represent the components of the second polarization-induced phase component in the interferogram phase (other phase components such as e.g. the first polarization-induced phase component, the phase component on account of the scalar phases of the diffractive structure, a phase component on account of the surface to be tested and possibly further phase components are not included here).

In equations (1) and (2) mentioned above, the superscripted numbers between parentheses identify the order of the terms with regard to the development with respect to the small magnitudes for dichroism and retardation of the diffractive structure. If d denotes the strength of the dichroism and r denotes the strength of the retardation for a wave produced at the diffractive structure, then the term $\varphi^{(2)}$ only contains terms with the products $d^2$, $r^2$ and $d \cdot r$. The superscripted number thus typically identifies the magnitude of the absolute value of the respective term, e.g. $\varphi^{(1)}$ is greater than $\varphi^{(2)}$ in terms of absolute value.

For the discussion of the terms which are independent of the polarization and the terms which are dependent on the polarization in the second polarization-induced phase effect, it is sufficient to consider only the absolute value of these terms because e.g. the signs (and also the absolute values) of the individual terms may be dependent on the position in the interferogram and the interfering waves respectively considered or because e.g. in the case of normally distributed manufacturing fluctuations of the individual optical elements with a polarization effect, the corresponding phases with subtraction of the nominal phases given ideal knowledge of the polarization elements may have different signs (and absolute values) with similar probability.

Under corresponding preconditions and approximations, it is also possible to specify an estimation for the interferogram phase of the first polarization-induced phase component, which is caused only by the polarization effect of the diffractive structure, for linear and orthogonal input polarizations $$\varphi_{1,linear} = \varphi_{1,unpol,linear}^{(2)} \pm \varphi_{1,pol,linear}^{(1)} \quad (3)$$

and for circular and orthogonal input polarizations.

$$\varphi_{1,circular} = \varphi_{1,unpol,circular}^{(2)} \pm \varphi_{1,pol,circular}^{(2)} \quad (4)$$

It should be noted that the terms in the second polarization-induced phase effect are still linearly dependent on the very small magnitudes for dichroism and retardation in the jointly traversed portions, for which reason the terms in the second polarization-induced phase effect are usually smaller than terms in the first polarization-induced phase effect.

Assuming that the diffractive structure is known in an ideal way, such that its scalar phases and the first polarization-induced phase component in the separately traversed portions are known in an ideal way, the second polarization-induced phase component can be reduced in each case by the transition from a circular to a linear input polarization and further by averaging of the interferogram phases for the two orthogonal input polarizations, since the order of the terms in the strengths of dichroism and retardation for the diffractive structure increases by one order in each step and the magnitude of the absolute values of the respective terms thus decreases step by step.

As a result, a reduction of the polarization-induced phase component (present besides the phase component that is actually to be determined in accordance with the figure of the test specimen) is achieved overall in the method according to the invention.

Figure 3:
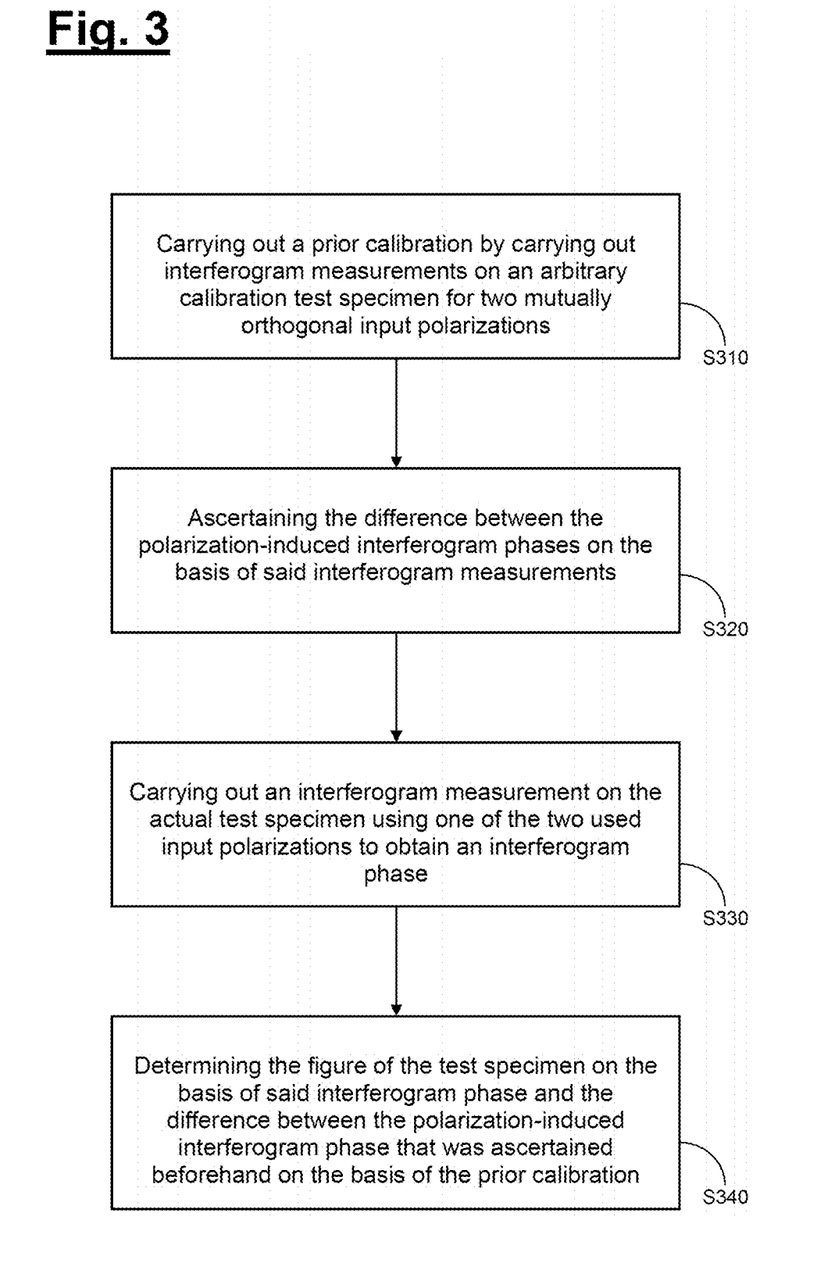

In order to avoid an increase in the measurement time that concomitantly arises when carrying out two interferogram measurements on the optical element in accordance with FIG. 2, in further embodiments in accordance with FIG. 3, in a step S310, it is also possible to carry out a prior calibration on a calibration sample (different than the optical element to be characterized with regard to the surface shape).

On the basis of said prior calibration, in step S320, it is then possible to determine the difference between the polarization-induced interferogram phases obtained for the mutually orthogonal input polarizations. Carrying out the actual interferogram measurement on the optical element to be characterized with regard to its surface shape then only has to be effected for one of the two input polarizations used in the prior calibration (step S330), wherein the figure determination can then be performed on the basis of the interferogram phase obtained here and the difference determined in step S320.

The mutually orthogonal input polarizations used in the prior calibration can also be linear input polarizations or else circular input polarizations. The interferogram measurements carried out in the prior calibration can then be utilized during the interferogram measurement carried out on the optical element that is actually to be characterized with regard to its surface shape for conversion to the corresponding average value for the two input polarizations used, in accordance with the formula $$\varphi_1 = 0.5 \cdot (\varphi_1 + \varphi_2) - 0.5 \cdot (\varphi_{1,k} + \varphi_{2,k}) + \varphi_{1,k} \quad (5)$$

In this case, $\varphi_1$ and $\varphi_2$ denote the two mutually orthogonal input polarizations, where the index k stands for the prior calibration.

As a result, the prior calibration described above makes it possible to avoid an increase in the measurement time that concomitantly arises when carrying out two interferogram measurements for the actual test specimen.

In further embodiments, the prior calibration can furthermore comprise an interferogram measurement using electromagnetic radiation having circular input polarization. In conjunction with such a prior calibration, it is possible to carry out the later interferogram measurement on the optical element that is actually to be characterized with regard to its surface shape for a circular input polarization (possibly desired for the purpose of contrast enhancement) as well, since the prior calibration can then be utilized for conversion into corresponding interferogram phases for the two mutually perpendicular linear input polarizations (or one averaged interferogram phase analogously to the embodiments above).

Figure 4:
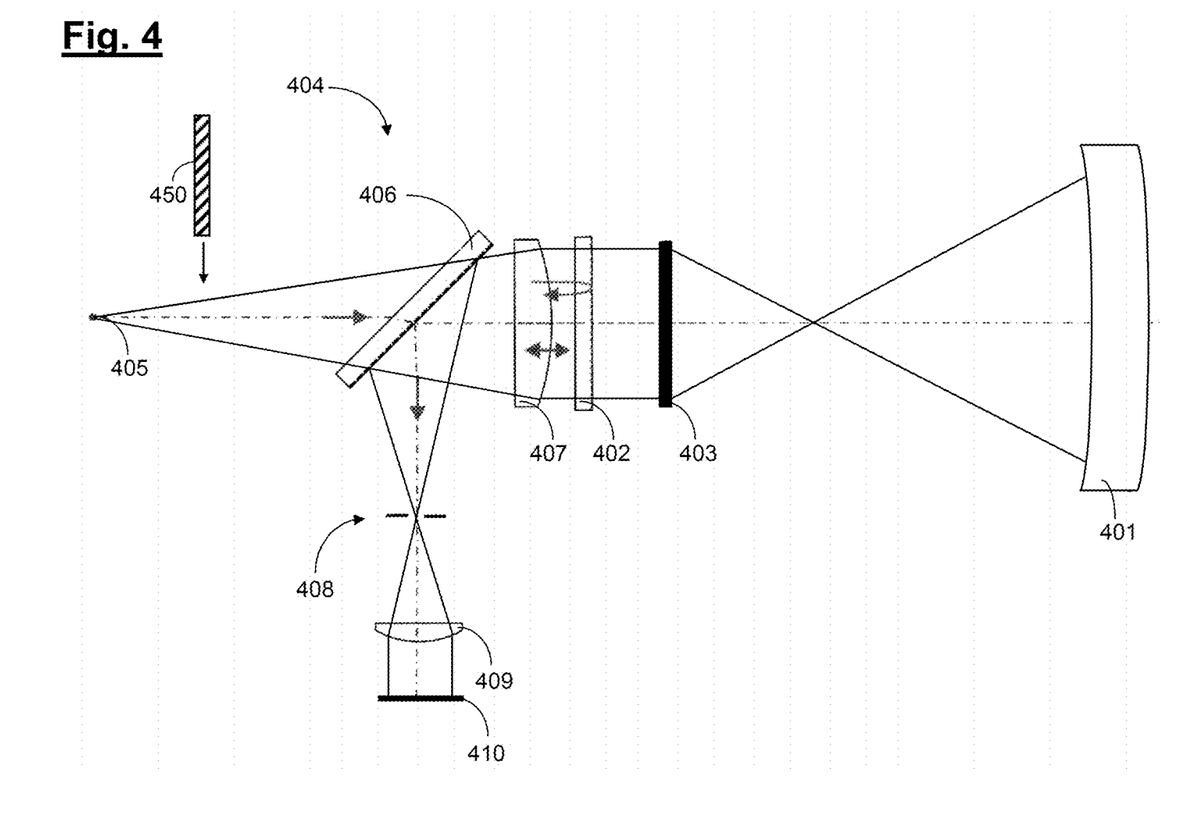
FIG. 4 shows a schematic illustration for elucidating a further possible set-up of an interferometric test arrangement that can be used in the method according to the invention.

FIG. 4 shows as an alternative to FIG. 1 the further exemplary configuration of an interferometric test arrangement.

In accordance with FIG. 4, in a Fizeau arrangement, an interferogram is generated between a reference wave reflected at a reference surface 402 ("Fizeau plate") and a test wave reflected at a mirror 401. In this case, the measurement light is shaped by a CGH 403 to form an aspherical wavefront that corresponds mathematically exactly to the "test specimen shape" (i.e. the shape of the relevant mirror 401) at a target distance. The wavefronts reflected firstly from the reference surface 402 and secondly from the relevant mirror 401 or test specimen interfere with one another in an interferometer 404 comprising, in accordance with FIG. 4, a light source 405, a beam splitter plate 406, a collimator 407, a stop 408, an eyepiece 409 and a CCD camera 410. An interferogram of the respective mirror 401 is recorded by the CCD camera 410.

Here, too, the corresponding input polarization is set using a polarization-influencing element 450, which is indicated merely schematically in FIG. 4 and which, analogously to FIG. 1, can be configured and arranged variably in the optical beam path in any suitable way.

Even though the invention has been described on the basis of specific embodiments, numerous variations and alternative embodiments will be apparent to the person skilled in the art, for example through combination and/or exchange of features of individual embodiments. Accordingly, such variations and alternative embodiments are concomitantly encompassed by the present invention, and the scope of the invention is restricted only within the meaning of the appended patent claims and the equivalents thereof.

What is claimed is:

1. A method for characterizing a surface shape of an optical element, comprising:
   in at least one interferogram measurement carried out by an interferometric test arrangement, causing a test wave reflected at the optical element to be superimposed with a reference wave not reflected at the optical element,
   determining a figure of the optical element based on at least two interferogram measurements using electromagnetic radiation having in each case linear input polarization or in each case circular input polarization,
wherein the input polarizations for the two interferogram measurements differ from one another, and
wherein the input polarizations for the two interferogram measurements correspond in terms of their polarization direction to the directions of eigenvectors of a Jones matrix that describes a polarization effect of the interferometric test arrangement in a region thereof traversed jointly by the reference wave and the test wave.

2. The method as claimed in claim 1, wherein the input polarizations for the two interferogram measurements are linear input polarizations having different polarization directions.

3. The method as claimed in claim 1, wherein the input polarizations for the two interferogram measurements are orthogonal to one another.

4. The method as claimed in claim 1, wherein the figure of the optical element is determined based on an averaging of interferogram phases respectively obtained during the two interferogram measurements.

5. The method as claimed in claim 1, wherein the two interferogram measurements are carried out on the optical element to be characterized with regard to a surface shape of the optical element.

6. The method as claimed in claim 1, wherein the two interferogram measurements are carried out in a prior calibration on a calibration probe that is different than the optical element to be characterized with regard to a surface shape of the optical element.

7. The method as claimed in claim 6, wherein the figure of the optical element is determined based on a difference between polarization-induced interferogram phases obtained for the two interferogram measurements used input polarizations, said difference being ascertained based on the prior calibration.

8. The method as claimed in claim 6, wherein the prior calibration comprises at least one interferogram measurement using electromagnetic radiation having circular input polarization.

9. The method as claimed in claim 1, wherein the optical element is a mirror.

10. The method as claimed in claim 1, wherein the optical element is configured for an operating wavelength of less than 30 nm.

11. The method as claimed in claim 1, wherein the optical element is an optical element of a microlithographic projection exposure apparatus.

12. A method for characterizing a surface shape of an optical element, comprising:
   in at least one interferogram measurement carried out by an interferometric test arrangement, causing a test wave reflected at the optical element to be superimposed with a reference wave not reflected at the optical element,
   determining a figure of the optical element based on an averaging of interferogram phases respectively obtained during two interferogram measurements,
wherein the input polarizations for said two interferogram measurements are orthogonal to one another, and
wherein the input polarizations for the two interferogram measurements correspond in terms of their polarization direction to the directions of eigenvectors of a Jones matrix that describes a polarization effect of the interferometric test arrangement in a region thereof traversed jointly by the reference wave and the test wave.

13. The method as claimed in claim 12, wherein the two interferogram measurements are carried out on the optical element to be characterized with regard to a surface shape of the optical element.

14. The method as claimed in claim 12, wherein the two interferogram measurements are carried out in a prior calibration on a calibration probe that is different than the optical element to be characterized with regard to a surface shape of the optical element.

15. The method as claimed in claim 14, wherein the figure of the optical element is determined based on a difference between polarization-induced interferogram phases obtained for the two interferogram measurements used input polarizations, said difference being ascertained based on the prior calibration.

16. The method as claimed in claim 14, wherein the prior calibration comprises at least one interferogram measurement using electromagnetic radiation having circular input polarization.

17. The method as claimed in claim 12, wherein the optical element is a mirror.

18. The method as claimed in claim 12, wherein the optical element is configured for an operating wavelength of less than 30 nm.

19. The method as claimed in claim 12, wherein the optical element is an optical element of a microlithographic projection exposure apparatus.

* * * * *